United States Patent
Yamamoto (10) Patent No.: US 7,215,407 B2
(45) Date of Patent: May 8, 2007

(54) TRANSPORT METHOD AND TRANSPORT APPARATUS FOR SEMICONDUCTOR WAFER

(75) Inventor: Masayuki Yamamoto, Osaka (JP)

(73) Assignee: Nitto Denko Corporation (JP)

( * ) Notice: Subject to any disclaimer, the term of this patent is extended or adjusted under 35 U.S.C. 154(b) by 198 days.

(21) Appl. No.: 10/867,784

(22) Filed: Jun. 16, 2004

(65) Prior Publication Data
US 2005/0007571 A1 Jan. 13, 2005

(30) Foreign Application Priority Data
Jul. 11, 2003 (JP) ............................. 2003-273275
Jul. 11, 2003 (JP) ............................. 2003-273276

(51) Int. Cl.
G03B 27/52 (2006.01)
G03B 27/58 (2006.01)
G03B 27/32 (2006.01)
G03B 27/62 (2006.01)

(52) U.S. Cl. ........................ 355/30; 355/75; 355/72; 355/77

(58) Field of Classification Search ................ 355/30, 355/72, 53, 75, 77; 356/237.1; 134/6; 15/301
See application file for complete search history.

(56) References Cited

U.S. PATENT DOCUMENTS

| | | | |
|---|---|---|---|
| 4,910,549 A * | 3/1990 | Sugita | 355/53 |
| 5,825,470 A * | 10/1998 | Miyai et al. | 355/72 |
| 6,573,979 B2 * | 6/2003 | Yamada | 355/72 |
| 6,867,855 B2 * | 3/2005 | Go et al. | 356/237.1 |
| 2003/0046786 A1 * | 3/2003 | Shirley et al. | 15/301 |
| 2005/0133061 A1 * | 6/2005 | de Larios et al. | 134/6 |

* cited by examiner

Primary Examiner—Peter B. Kim
(74) Attorney, Agent, or Firm—Rader, Fishman & Grauer PLLC (57) ABSTRACT

First brush bristles of an alignment stage cleaning mechanism are pressed on a wafer suction stage of the alignment stage before a semiconductor wafer is transported onto the alignment stage, in which state the wafer suction stage rotates to thereby remove dust attached to the wafer suction stage. Moreover, second brush bristles of a wafer chuck table cleaning mechanism are moved on and along a surface facing downward of a wafer chuck table to thereby remove dust attached to the surface facing downward of the wafer chuck table.

7 Claims, 10 Drawing Sheets

TRANSPORT METHOD AND TRANSPORT APPARATUS FOR SEMICONDUCTOR WAFER

BACKGROUND OF THE INVENTION

1. Field of the Invention

The present invention relates to a transport method and a transport apparatus for a semiconductor wafer (hereinafter, also referred to as a "wafer" for short).

2. Description of the Related Art

Generally, the following procedure has been adopted. In grinding (back grinding) of the back surface of a wafer having been finished with a pattern forming processing, for example, a protective tape is applied to the front surface of the wafer in advance and, also, a portion of the protective tape extending out from the wafer periphery is also cut off. Moreover, the wafer the front surface of which is all protected with the protective tape is suction-held by a sucking disc at the front surface thereof and subjected to grinding and, thereafter, the back surface thereof is suction-held at part thereof to change places of the wafer and transfer to various processing tables.

In recent years, there has been a tendency that a wafer thickness after grinding the back surface of a wafer is thinner and thinner. As a result of the tendency, a rigidity of a wafer itself thus ground to be thinner is reduced, thereby generating a warp in the wafer even with a slight stress generated in a surface thereof.

A wafer with such a warp, when being transferred while part of a front or back surface thereof is suction-held, suffers deficiency in vacuum suction and shifts its position during transfer, leading to an inconvenience to disable the transfer to have a stably high accuracy. Hence, the front or back surface of a wafer has been held by vacuum suction using an area nearly as large as the whole of the front or back surface thereof when being held with a wafer holding means such as an alignment stage or a wafer chuck table.

In recent years, however, the front and back surfaces of a wafer have been brought into contact with a wafer holding means such as an alignment stage or a wafer chuck table at nearly the whole surface areas of the wafer; therefore, dust (foreign matter) generated by the contact are conspicuously accumulated on the wafer holding means and dust attached to a wafer increases with a rise in the number of handled other wafers, which has resulted in occurrence of defective products, and in turn in reduction in production yield.

SUMMARY OF THE INVENTION

The present invention has been made in light of such circumstances. An object of the present invention is to provide a semiconductor wafer transport method capable of avoiding reduction in a production yield caused by dust attached to a wafer holding means and, also, another object of the present invention is to provide a semiconductor wafer transport apparatus capable of suitably implementing the semiconductor wafer transport method.

In order to achieve such objects, the present invention adopts the following constructions.

The present invention is directed to a semiconductor wafer transport method transporting of a semiconductor wafer to various kinds of processing steps, and the method comprises the following step:

a step of removing dust attached to a portion with which the semiconductor wafer is brought into contact by holding the semiconductor wafer in advance of the contact of the portion with the semiconductor wafer.

According to a semiconductor wafer transport method of the present invention, dust attached to a portion with which a semiconductor wafer is brought into contact can be removed before the wafer is brought into contact with the portion.

Therefore, it can be prevented that dust attached to a wafer holding means migrates to the semiconductor wafer as a result of holding the semiconductor wafer to thereby contaminate the semiconductor wafer, and it can be avoided to reduce a production yield due to dust attached to the semiconductor holding means.

In the present invention, the contact portion is preferably a portion with which the back surface side of the semiconductor is brought into contact.

According to the method, dust attached to the portion with which the back surface side of the semiconductor wafer is brought into contact can be removed before the semiconductor wafer is brought into contact with the portion.

Therefore, it can be prevented that dust attached to a wafer holding means migrates to the back surface of the semiconductor wafer as a result of holding the semiconductor wafer to thereby contaminate the semiconductor wafer, and it can be avoided to reduce a production yield due to the dust attached to the wafer holding means.

In the present invention, the contact portion is preferably a portion with which the front surface side of the semiconductor is brought into contact.

According to the method, dust attached to the portion with which the front surface side of the semiconductor wafer is brought into contact can be removed before the semiconductor wafer is brought into contact with the portion.

Therefore, it can be prevented that dust attached to a wafer holding means migrates to the semiconductor wafer as a result of holding the semiconductor wafer to thereby contaminate the semiconductor wafer, and it can be avoided to reduce a production yield due to dust attached to the semiconductor holding means.

In a case where a surface protective adhesive tape is applied to a surface of a semiconductor wafer, even if foreign matter generated in tape grinding is attached to the adhesive tape and the dust migrates to a wafer holding means as a result of contact with the wafer holding means, the foreign matter can be removed and reduction in a production yield caused by the foreign matter attached to the wafer holding means can be avoided.

In order to achieve such objects, the present invention also adopts the following construction.

The present invention is directed to a semiconductor wafer transport method of transporting a semiconductor wafer to various kinds of processing steps, and the method comprises the following step:

a step of removing dust attached to the semiconductor wafer in a state where the semiconductor wafer is held.

According to a semiconductor wafer transport method of the present invention, dust attached to the semiconductor wafer can be removed, and the semiconductor wafer can be prevented from being contaminated.

Therefore, it can be avoided to reduce a production yield due to dust attached to the semiconductor wafer.

In the present invention, it is preferable to remove dust attached to the back surface side of the semiconductor wafer.

According to the method, dust attached to the back surface side of the semiconductor wafer can be removed, and the semiconductor wafer can be prevented from being contaminated.

Therefore, it can be avoided to reduce a production yield due to dust attached to the back surface side of the semiconductor wafer.

In the present invention, it is preferable to remove dust attached to the front surface side of the semiconductor wafer.

According to the method, dust attached to the front surface side of the semiconductor wafer can be removed, and the semiconductor wafer can be prevented from being contaminated.

Therefore, it can be avoided to reduce a production yield due to dust attached to the front surface side of the semiconductor wafer.

In the present invention, it is preferable to remove dust attached to the front surface side of an adhesive tape applied to a front surface of a semiconductor wafer.

According to the method, in a case where the adhesive tape, as a surface protective tape, is applied to a surface of the semiconductor wafer, dust such as grinding foreign matter attached to the front surface side of the adhesive tape is removed, thereby enabling attachment of dust to the semiconductor wafer to be prevented when the adhesive tape is separated in postprocessing.

Therefore, it can be avoided to reduce a production yield due to dust attached to the front surface side of the adhesive tape applied to a surface of the semiconductor wafer.

In order to achieve such objects, the present invention also adopts the following construction.

The present invention is directed to a semiconductor wafer transport apparatus equipped with a wafer holding means placement-holding or/and suction-holding a semiconductor wafer thereon in transportation of the semiconductor wafer, and the apparatus comprises:

a dust removing means, provided to the wafer holding means, for removing dust attached to a portion thereof with which the semiconductor wafer is brought into contact.

According to a semiconductor wafer transport apparatus of the present invention, dust attached to a portion with which the semiconductor wafer is brought into contact can be removed by a dust removing means before the semiconductor wafer is held with a wafer holding means and thereby brought into contact with the portion.

Therefore, it can be prevented that during transportation of the semiconductor wafer, dust attached to the wafer holding means migrates to the semiconductor wafer side as a result of holding the semiconductor wafer. Moreover, it can be avoided to reduce a production yield due to dust attached to the wafer holding means. As a result, transportation of the semiconductor wafer and dust removal at a portion of the wafer holding means with which the semiconductor wafer is brought into contact can be efficiently conducted, thereby enabling a transport apparatus capable of suitably implementing the semiconductor wafer transport method to be provided.

In the present invention, it is preferable that the wafer holding means is an alignment stage on which a semiconductor wafer is not only placed but also suction-held and aligned, and the dust removing means removes dust attached to a wafer placement surface of the alignment stage.

According to the construction, dust attached to the wafer placement surface of the alignment stage with which the semiconductor wafer is brought into contact can be removed with dust removing means before the semiconductor wafer is held and aligned on the alignment stage.

Therefore, dust attached to the wafer placement surface of the alignment stage by contact of the wafer placement surface of the alignment stage with the semiconductor wafer is prevented from migrating to the semiconductor wafer side as a result of holding the semiconductor wafer and it can be avoided to reduce a production yield due to dust attached to the wafer placement surface of the alignment stage. As a result, transportation of the semiconductor wafer and removal of dust on the wafer placement surface of the alignment stage with which the semiconductor wafer is brought into contact can be efficiently conducted, thereby enabling a semiconductor wafer transport method to be suitably applied to the transport apparatus equipped with the alignment stage.

In the present invention, the dust removing means is an arm having brush bristles implanted on an opposite surface thereof to the wafer holding means.

In addition, it is preferable to construct the arm so as to reciprocate on the wafer placement surface of the alignment stage, to locate the arm in the vicinity of the alignment stage so that one end thereof is pivotable around a shaft axis in the vertical direction and moreover to rotate a wafer suction stage of the alignment stage.

According to the constructions, a semiconductor wafer transport method can be suitably applied to a transport apparatus equipped with an alignment stage.

In the present invention, the wafer holding means is a wafer chuck table suction-holding a semiconductor wafer.

In addition, it is preferable that the dust removing means removes dust attached to a wafer suction surface of the wafer chuck table.

According to the construction, dust attached to the wafer suction surface of the wafer chuck table with which the semiconductor wafer is brought into contact can be removed by the dust removing means before the semiconductor wafer is suction-held on the wafer chuck table.

Therefore, it can be prevented that the wafer suction surface of a wafer chuck table and a semiconductor wafer are brought into contact with each other to thereby cause dust attached to the wafer suction surface of the wafer chuck table to migrate to the semiconductor wafer side as a result of suction-holding the semiconductor wafer, it is avoided to reduce a production yield due to dust attached to the wafer suction surface of a wafer chuck table, and it can be efficiently conducted to transport the semiconductor wafer and to remove dust on the wafer suction surface of a wafer chuck table with which the semiconductor wafer is brought into contact, thereby enabling a semiconductor transport method to be suitably applied to a transport apparatus equipped with the wafer chuck table.

In order to achieve such objects, the present invention also adopts the following construction.

The present invention is directed to a semiconductor wafer transport apparatus equipped with a wafer holding means placement-holding or/and suction-holding a semiconductor wafer thereon in transportation of the semiconductor wafer, and the apparatus comprises:

a dust removing means for removing dust attached to the semiconductor wafer held in the wafer holding means or to a surface protective adhesive tape applied to the semiconductor wafer.

According to a semiconductor wafer transport apparatus of the present invention, dust attached to the semiconductor wafer or a surface protective adhesive tape applied to the semiconductor wafer can be removed with the dust removing means; therefore, it can be prevented that dust is attached to the semiconductor wafer and, also, it can be avoided that dust stays and is accumulated in the apparatus.

Therefore, it can be avoided to reduce a production yield due to dust attached to the semiconductor wafer or to the surface protective adhesive tape applied to the semiconductor wafer, thereby enabling the apparatus capable of suitably implementing a semiconductor wafer transport method.

In the present invention, the wafer holding means is an alignment stage not only placing but also suction-holding a semiconductor wafer and aligning the wafer.

In addition, it is preferable that the dust removing means removes dust attached to a surface of the semiconductor wafer held on the alignment stage.

According to the construction, dust attached to a surface of a semiconductor wafer in a state where the semiconductor wafer is held on the alignment stage can be removed with dust removing means.

Therefore, it can be avoided to reduce a production yield due to dust attached to a surface of a semiconductor wafer transported onto the alignment stage, and it can be efficiently conducted to transport the semiconductor wafer and remove dust on a surface of the semiconductor placement-held on the alignment stage, thereby enabling a semiconductor transport method to be suitably applied to the transport apparatus equipped with the alignment stage.

In the present invention, the dust removing means is an arm having brush bristles implanted an opposite surface thereof to the wafer holding means.

In addition, it is preferable to construct the arm so as to reciprocate on the wafer placement surface of the alignment stage, to locate the arm in the vicinity of the alignment stage so that one end thereof is pivotable around a shaft axis in the vertical direction and moreover to rotate a wafer suction stage of the alignment stage.

According to the constructions, a semiconductor wafer transport method can be suitably applied to the transport apparatus equipped with an alignment stage.

In the present invention, the wafer holding means is a wafer chuck table suction-holding a semiconductor wafer.

In addition, it is preferable that the dust removing means removes dust attached to the back surface of the semiconductor wafer suction-held on the wafer chuck table.

According to the construction, dust attached to a surface of a semiconductor wafer can be removed with dust removing means in a state where the semiconductor wafer is suction-held on the wafer chuck table.

Therefore, it can be avoided to reduce a production yield due to dust attached to a back surface of a semiconductor wafer transported onto the wafer chuck table and it can be efficiently conducted to transport the semiconductor wafer and remove dust on a surface of the semiconductor wafer suction-held on the wafer chuck table, thereby enabling a semiconductor transport method to be suitably applied to the transport apparatus equipped with a wafer chuck table.

BRIEF DESCRIPTION OF THE DRAWINGS

For the purpose of illustrating the invention, there are shown in the drawings several forms of which are presently preferred, it being understood, however, that the invention is not limited to the precise arrangement and instrumentalities shown.

DESCRIPTION OF THE PREFERRED EMBODIMENTS

Hereinafter, description will be given of embodiments of the present invention with reference to the accompanying drawings.

First Embodiment

Figure 1:
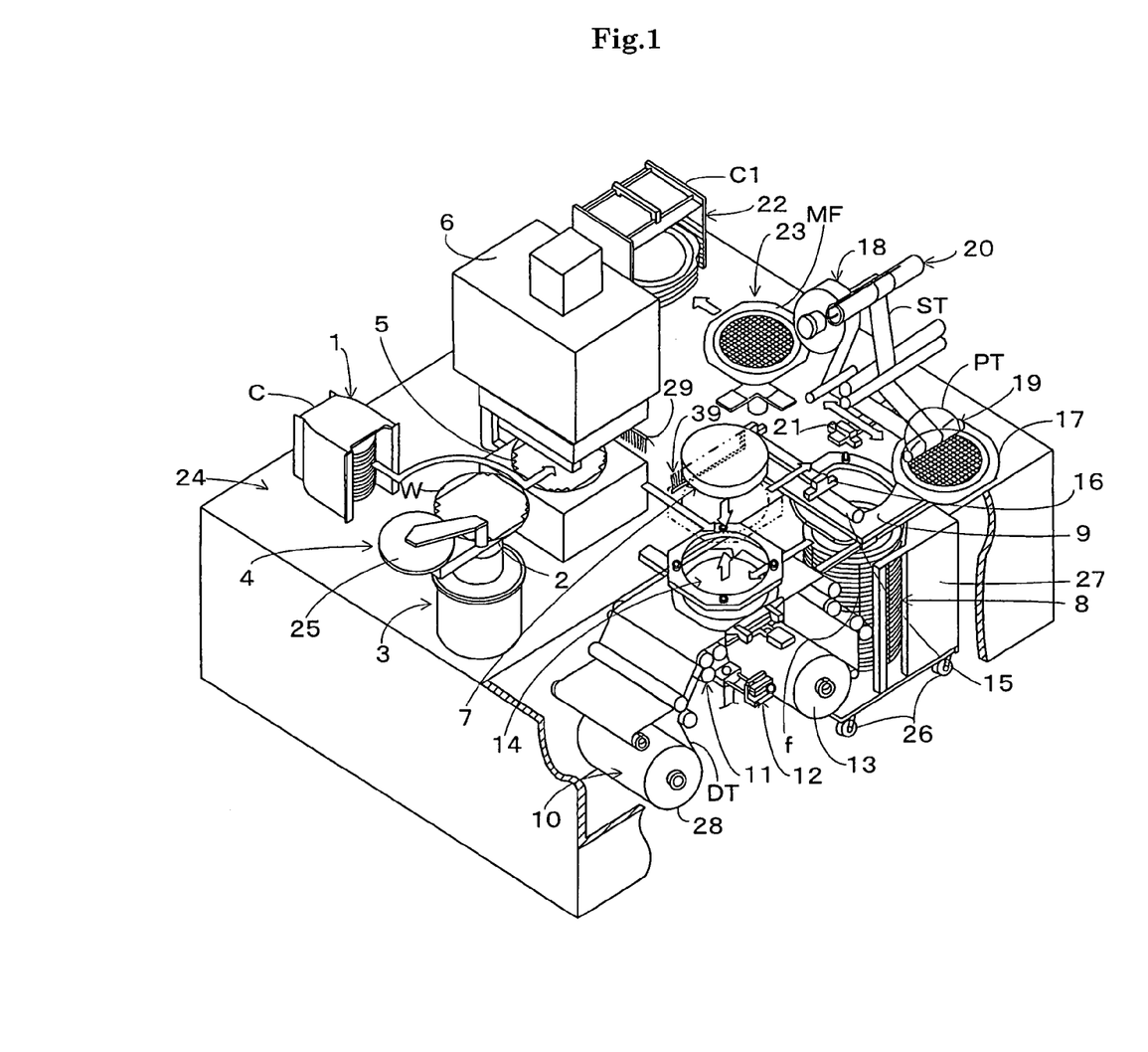
FIG. 1 is a partially cutaway perspective view of an overall construction of a first embodiment of a semiconductor wafer mounting apparatus equipped with a semiconductor wafer transport apparatus related to the present invention.

FIG. 1 is a partially cutaway perspective view of an overall construction of the embodiment of a semiconductor wafer mounting apparatus equipped with a semiconductor wafer transport apparatus related to the present invention. Note that in the embodiment, an ultraviolet curable adhesive tape as a surface protective tape is applied to a patterned surface (front surface) of a semiconductor wafer W (hereinafter, also simply referred to as a "wafer W").

A semiconductor wafer mounting apparatus includes: a wafer supply station 1 where loaded is a cassette C accommodating wafers W, on which grinding of a back surface (back grinding) has been completed, stacked in multiple layers; a wafer transport mechanism 3 having a robot arm 2 pivoting while bending; a wafer pressing mechanism 4 to correct a warped wafer W to be planar; an alignment stage 5 as a wafer holding means on which the wafer W is placement-held and aligned; an ultraviolet illumination unit 6 illuminating the wafer W that is placed on the alignment stage 5 with ultraviolet; and a wafer chuck table 7 as a wafer holding means suction-holding the wafer W.

The semiconductor wafer mounting apparatus further includes: a ring frame supplying unit 8 in which ring frames f in a ring-like shape are stacked in multiple layers; a ring flame transport mechanism 9 transferring a ring frame f to a dicing tape DT; a dicing tape server 10 supplying the dicing tape DT; a dicing tape applying unit 11 applying the dicing tape DT to the back surface of the ring frame f; a dicing tape cutting unit 12 cutting the dicing tape DT; a dicing tape collector 13 collecting the dicing tape DT after the cutting; a ring frame lift mechanism 14 moving upward or downward the ring frame f to which the dicing tape DT has been applied; a wafer mount mechanism 15 adhering the wafer W to the ring frame f to which the dicing tape DT has been applied; and a wafer mount frame transport mechanism 16 transferring the wafer mount frame MF to which the wafer W has been integrally adhered in a single piece.

The semiconductor wafer mounting apparatus further includes: a separator table 17 separating a surface protective tape PT having been applied to the wafer W while the wafer mount frame MF is suction-held; a separator tape server 18 supplying a separator tape ST; a tape separator unit 19 applying the separator tape ST to the wafer W on the separator table 17 to separate the surface protective tape PT; a tape collector 20 applying the separated surface protective tape PT to the separator tape ST to thereby collect the surface protective tape PT; a wafer mount flame accommodating mechanism 21 accommodating the wafer mount frames MF having been processed; a wafer mount frame collector 22 in which loaded is a cassette C1 accommodating the wafer mount frames MF having been processed, which are stacked in multiple layers; and a wafer mount frame transport mechanism 23 transporting the wafer mount flames MF having been processed to the wafer mount frame collector 22 from the wafer mount frame accommodating mechanism 21.

The wafer supplying station 1 is constituted with the cassette C placed on a cassette table 24 and the cassette C accommodates the wafers W in a horizontal posture each with a front surface to which the surface protective tape PT is applied facing upward, being inserted at a proper spacing in a vertical direction in the cassette C. The wafer mount frame collector 22 is also constituted with a cassette C1 placed on the cassette table 24 and the cassette C1 accommodates the wafer mount frames MF in each of which mounted is the wafer W from which the surface protective tape PT have been separated, being inserted at a proper spacing in a vertical direction in the cassette C1.

The robot arm 2 of the wafer transport mechanism 3 is provided so as to be movable forward and backward in a horizontal direction and to be pivotable around a shaft axis in a vertical direction by a driving mechanism not shown and constructed so as to be able to take out the wafers W individually from the cassette C of the wafer supply station 1 and supply the wafers W individually to the alignment stage 5.

The wafer pressing mechanism 4 is provided with a pressing plate 25 pressing the wafer W on the upper surface thereof and in a case where the wafer W supplied onto the alignment stage 5 cannot be held by vacuum-suction due to a warp of the wafer W, the wafer W is pressed with the pressing plate 25, thereby enabling the wafer W to be corrected to be planar.

The alignment stage 5 is constructed so that alignment of the wafer W, is conducted based on a detected orientation flat, notch or the like of the wafer W.

The alignment stage 5 is further constructed so that the wafer W can be transferred over from an initial position where the wafer W is placed and aligned thereon to a standby position located between the wafer chuck table 7 and the ring frame lift mechanism 14 while the wafer W thereon is suction-held.

The ultraviolet illumination unit 6 is constructed so that in a case where the surface protective tape PT applied to a surface of the wafer W is an ultraviolet curable adhesive tape, an adhesive strength of the surface protective tape PT to a surface of the wafer W is alleviated by ultraviolet illumination.

The wafer chuck table 7 is in nearly the same circular shape as the wafer W so that the table 7 covers a surface of the wafer W and vacuum suction can be applied to the surface of the wafer W and is further constructed so that the wafer W on the alignment stage 5 can be vertically moved over from the standby position to a position where the wafer W is applied to the ring frame f by a driving mechanism not shown.

The wafer chuck table 7 is constructed so that the table 7 is fitted into an opening of the ring frame lift mechanism 14 suction-holding the ring frame f on the back surface of which the dicing tape DT is applied and moved downward to a position where the wafer W approaches to the dicing tape DT in the middle of the ring frame f.

The ring frame supplying unit 8 is a wagon provided with casters 26 on the lower side of the bottom thereof and in which the ring frames f are accommodated being stacked therein at respective determined positions in a given direction. The ring frame transport mechanism 9 is configured so that the ring frames f accommodated in the ring frame supplying unit 8 are sequentially held by vacuum-suction one at a time starting the uppermost ring frame f and transported to a position where the dicing tape DT is applied thereto.

The dicing tape sever 10 is constructed so that the dicing tape DT unwound from a master roll 28 passes by below the ring frame f and is guided to the dicing tape applying unit 11 and to the dicing tape collector 12. The dicing tape DT in use is more in width than a diameter of the ring frame f.

The dicing tape applying unit 11 applies the dicing tape DT to the ring frame f and then the dicing tape DT is cut on the ring frame f with the dicing tape cutting unit 12. The dicing tape DT remaining after the cutting is collected in the dicing tape collector 13.

The ring frame lift mechanism 14 vertically moves the ring frame f to which the dicing tape DT is applied.

The wafer mount mechanism 15 applies the wafer W to which the dicing tape DT is applied, to the ring flame f.

The wafer mount frame transport mechanism 16 transports, while holding by vacuum-suction the wafer mount frame MF that has been processed, the wafer mount frame MF to the wafer mount frame collector 22 from the wafer mount frame accommodating mechanism 21.

The separator table 17 is constructed so that the wafer mount frame MF can be held by vacuum-suction.

The tape separator unit 19 applies the separator tape ST to the surface protective tape PT on the wafer W so as to separate the separator tape ST and the surface protective tape PT as a single piece. The separator tape ST in use is less in width than a diameter of the wafer W.

The tape collector 20 collects the separator tape ST having been separated and processed.

The wafer mount frame accommodating mechanism 21 transfers the wafer mount frame MF while holding by vacuum-suction to the wafer mount frame transport mechanism 16.

Figure 2:
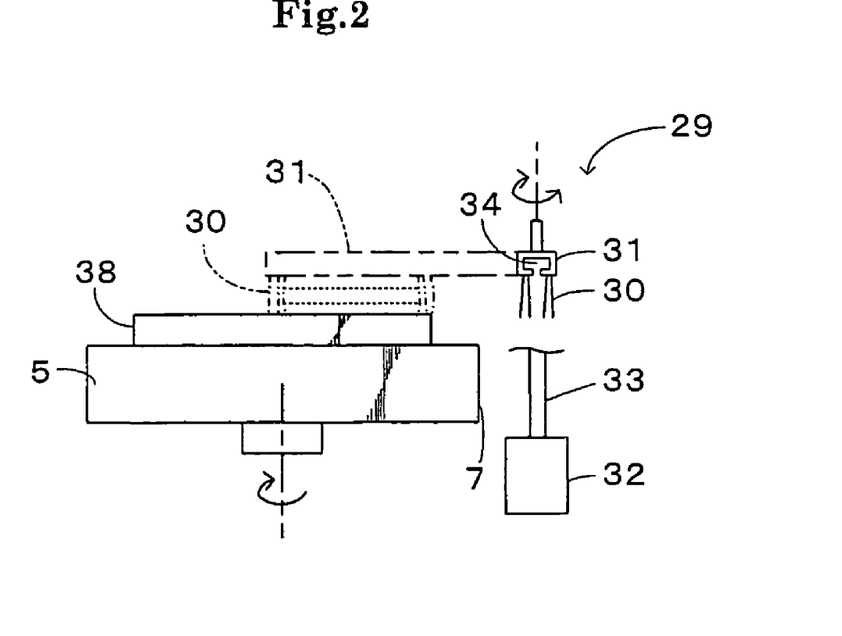
FIG. 2 is a side view of a principal portion showing an alignment stage cleaning mechanism.
Figure 3:
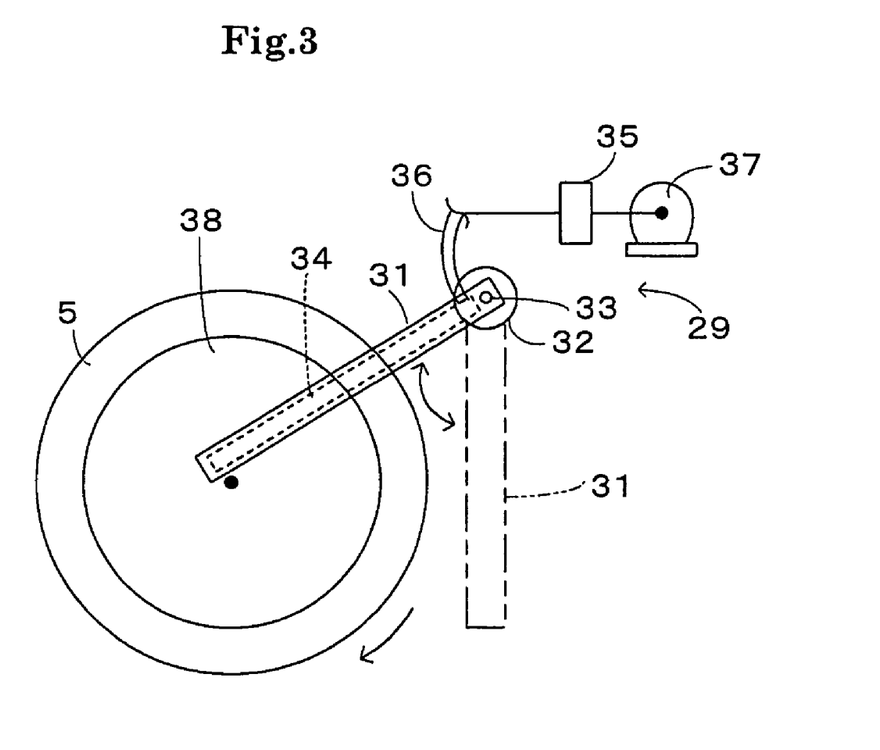
FIG. 3 is a top plan view of the principal portion showing an alignment stage cleaning mechanism.

The alignment stage cleaning mechanism 29 is provided as a dust removing means in the vicinity of an alignment stage 5 as shown in the side view of a principal portion of FIG. 2 and in the top plan view of a principal portion of FIG. 3.

The alignment stage cleaning mechanism 29 is constructed so that a first brush arm 31 on which first brush bristles 30 are implanted is mounted to a rotary support pole 33 rotatable around the axis thereof extending in a vertical direction with an electric motor 32 rotatable in a normal or reverse direction.

The first brush arm 31 is further constructed so as to move between a working position farther than the center of rotation of the alignment stage 5 and a position where the arm 31 does not overlap the alignment stage 5.

In addition, a first vent path 34 is formed in the first brush arm 31 and, also, the first vent path 34 is open on the lower surface of the first brush arm 31 and a first vacuum pump 37 is connected in communication with the first vent path 34 on the pivotal center side of the first brush arm 31 through a first suction pipe 36 in which a first filter 35 is in series inserted.

With the construction described above, the first brush bristles 30 are shifted to a position where the first brush bristles 30 works on the wafer suction stage 38 as a contact portion on the alignment stage 5 before the wafer W is transported onto the alignment stage 5, in which state the wafer suction stage 38 is rotated to thereby enable dust attached on the wafer suction stage 38 to be removed and sucked away.

Figure 4:
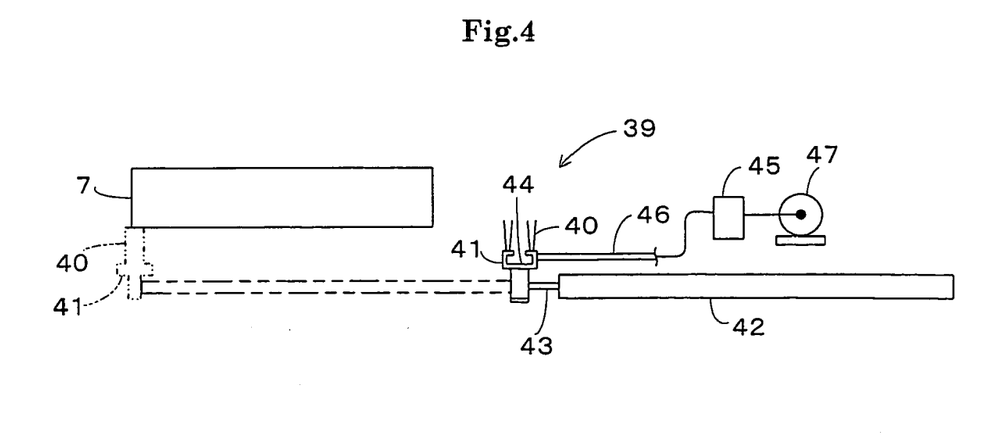
FIG. 4 is a side view of a principal portion showing a wafer chuck table cleaning mechanism.
Figure 5:
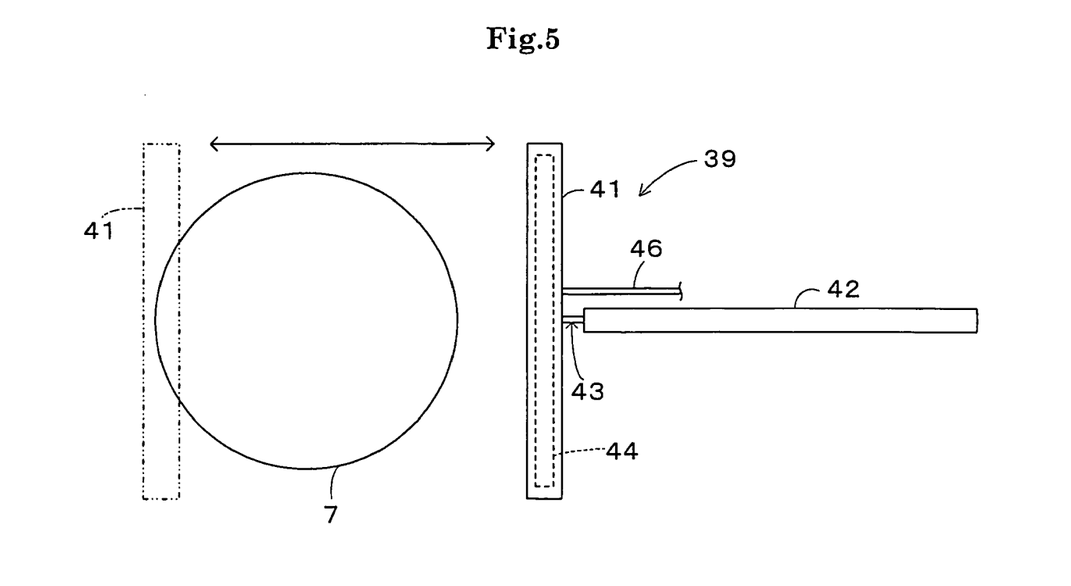
FIG. 5 is a bottom plan view of the principal portion showing a wafer chuck table cleaning mechanism.

The wafer chuck table cleaning mechanism 39 is provided as a dust removing means in the vicinity of the wafer chuck table 7 as shown in the side view of a principal portion of FIG. 4 and in the bottom plan view of a principal portion of FIG. 5.

The wafer chuck table cleaning mechanism 39 is of a construction in which a second brush arm 41 on which second brush bristles 40 are implanted so as to extend upward is attached to a cylinder rod 43 capable of moving forward or backward in a horizontal direction with an air cylinder 42.

The second brush arm 41 is constructed so as to be movable forward or backward to a position farther than the farthest end of the wafer chuck table 7 in a top plan view.

In addition, a second vent path 44 is formed in the second brush arm 41 and, also, the second vent path 44 is open on the upper surface of the second brush arm 41 and a second vacuum pump 47 is connected in communication with the second vent path 44 at the middle of the second brush arm 41 in the length direction through a second suction pipe 46 in which a second filter 45 is in series inserted.

With the construction described above, the second brush bristles 40 are shifted to a position where the second brush bristles 40 works on the surface facing downward as a contact portion of the wafer chuck table 7 before the wafer W is transported onto the wafer chuck table 7 and suction-held thereon, in which state dust attached on the surface facing downward as a contact portion of the wafer chuck table 7 can be removed and sucked away.

Figure 6:
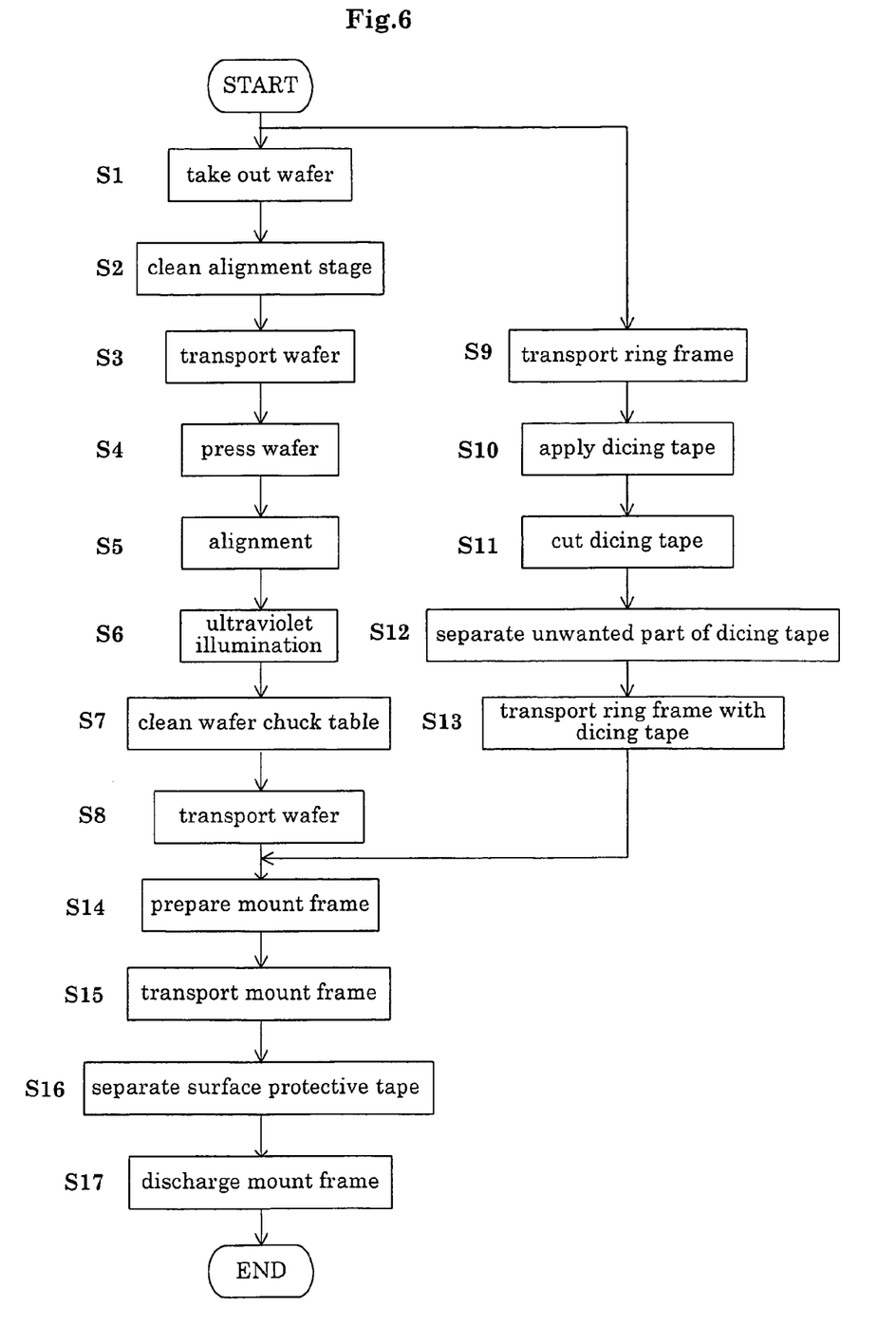
FIG. 6 is a flowchart describing a transport operation with a semiconductor wafer transport apparatus.

Then, description will be given of a transport operation by the above-described semiconductor wafer transport apparatus with reference to a flowchart of FIG. 6.

At first, the robot arm 2 is not only pivoted but also stretched or shrunk and moved upward or downward to thereby take out one wafer W while suction-holding from the cassette C of the wafer supplying station 1 (S1). The first brush bristles 30 are then pushed down to the wafer suction stage 38 of the alignment stage 5 before the transportation to the alignment stage 5, in which state the wafer suction stage 38 is rotated while the first vacuum pump 37 is driven to remove dust attached on the wafer suction stage (S2).

After the dust removal, the robot arm 2 is not only pivoted, but also stretched or shrunk and moved upward or downward to thereby transport and transfer the wafer W onto the alignment stage 5 (S3) and the pressing plate 25 is stretched or shrunk and moved upward or downward with the wafer pressing mechanism 4 to thereby press and correct the wafer W to be planar, in which state the wafer W is suction-held (S4).

In the state retained, the wafer suction stage 38 is rotated to thereby align the wafer W based on a detected orientation flat, a notch or the like thereof (S5).

Thereafter, the surface protective tape PT applied to the wafer W, when being of an ultraviolet curable type, is illuminated with ultraviolet on the alignment stage 5 with the ultraviolet illumination unit 6 (S6).

Then, the second brush bristles 40 are shifted to the surface facing downward of the wafer chuck table 7 while the second vacuum pump 47 is driven to thereby remove dust attached on the surface facing downward of the wafer chuck table 7 (S7).

After that, the alignment stage 5 is moved to a position under the wafer chuck table 7. The wafer chuck table 7 is vertically moved while the wafer W is kept in the planar state. The wafer W having been subjected to an alignment operation is received by the wafer chuck table 7 (S8). The alignment stage 5 having released the wafer W returns to the initial position.

On the other hand, the ring frame transport mechanism 9 sucks by vacuum and takes out an uppermost one and then a next one of the ring frames f stored in the wagon 27, and each ring frame f taken out is aligned on the alignment stage not shown, and then transported to the position, above the dicing tape DT, for applying the dicing tape DT (S9).

Then, the dicing tape DT is applied to the ring frame f with the dicing tape applying unit 11 (S10), followed by cutting of the dicing tape DT on the ring frame f (S11).

The cut, unwanted part of the dicing tape DT is separated from the ring frame f and taken up on the dicing tape collector 13 (S12), the ring frame f to which the dicing tape DT has been applied is prepared and the ring frame f with the dicing tape DT is raised with the ring frame lift mechanism 14 and caused to approach the wafer W that is suction-held on the wafer chuck table 7 (S13).

Then, a mount roller (not shown) is vertically moved, upward or downward, and then laterally moved starting at the lower end of the ring frame f to apply the ring frame f to the wafer W with the dicing tape DT interposed therebetween and to thereby prepare a wafer mount frame MF (S14).

Thereafter, thus prepared wafer mount frame MF is transported with the wafer mount frame transport mechanism 16 onto the separator table 17 to be suction-held there (S15).

The separator table 17 on which the mount frame MF is placed is moved to below the tape separator unit 19 and the separator tape ST supplied from the separator tape server 18 is pressed and applied to the surface protective tape PT on the wafer W and then the applied separator tape ST together with the surface protective tape PT is separated from the surface of the wafer W (S16).

Thereafter, the wafer mount frame MF from which the surface protective tape PT has been separated is discharged from the tape separator unit 19, positioned based on an orientation flat, a notch or the like of the wafer W with the wafer mount frame accommodating mechanism 21 so as to adjust a direction of accommodation and accommodated into the cassette C1 of the wafer mount frame collector 22 using the mount frame transport mechanism 23, in which way the subsequent wafer mount frames MF are processed one at a time (S17).

While in the above embodiment, the alignment stage cleaning mechanism 29 is constructed so that the first brush bristles 30 are brought into contact with the wafer suction stage 38 and the wafer suction stage 38 is rotated to thereby remove dust, other constructions may be adopted in which the first brush arm 31 is more in length than a diameter of the wafer suction stage 38 and reciprocates over the wafer suction stage 38 with an air cylinder or the like, and in which one end in the length direction of the first brush arm 31 is pivotable around a shaft axis in a vertical direction in the vicinity of the wafer suction stage 38 to thereby cause the first brush bristles 30 to act on all the surface of the wafer suction stage 38 and remove away dust thereon.

While in the above embodiment, the wafer chuck table cleaning mechanism 39 is constructed so that the second brush bristles 40 are brought into contact with the surface facing downward of the wafer chuck table 7 and are reciprocated in a horizontal direction to thereby remove away dust thereon, another construction may be adopted in which one end of the second brush arm 41 is pivotable around a shaft axis in a vertical direction in the vicinity of the wafer chuck table 7 to thereby cause the second brush bristles 40 to act on all the surface facing downward of the wafer chuck table 7 and remove away dust thereon.

While in the above embodiment, removed dust is sucked away with the first and second vacuum pumps 37 and 47, other constructions may be adopted instead in which, without using the above-described construction, while in cleaning, used are vacuum suction mechanisms provided to the wafer suction stage 38 of the alignment stage 5 and the wafer chuck table 7, respectively, and dust removed by the first and second brush bristles 30 and 40 are sucked away.

While dust removing means are constructed so that the first and second brush bristles 30 and 40 remove away dust, various kinds of constructions and methods can be applied as dust removing means in the present invention as far as dust removal and cleaning is enabled: such as dust removal by suction, blowing of a gas, an adhesive sheet or a combination thereof, or the like.

A construction may be adopted in which wafers W each on the front and back surfaces of which dust collecting adhesive tape that has been proposed as means for dust removal and cleaning are supplied in the process flow to thereby apply dust to the adhesive tape and remove it away.

While in the above embodiment, there is shown a case where a wafer mount frame MF are prepared, the present invention can be applied in all of cases in each of which a portion with which a semiconductor wafer is brought into contact is present and the semiconductor wafer is processed.

Second Embodiment

In a second embodiment, a construction is adopted in which a first wafer cleaning mechanism 290 is provided instead of the alignment stage cleaning mechanism 29 as the dust removing means of the first embodiment.

Therefore, constituents with the same constructions as in the first embodiment are attached with the same symbols and detailed descriptions are given only of constituents with different constructions therefrom.

Figure 7:
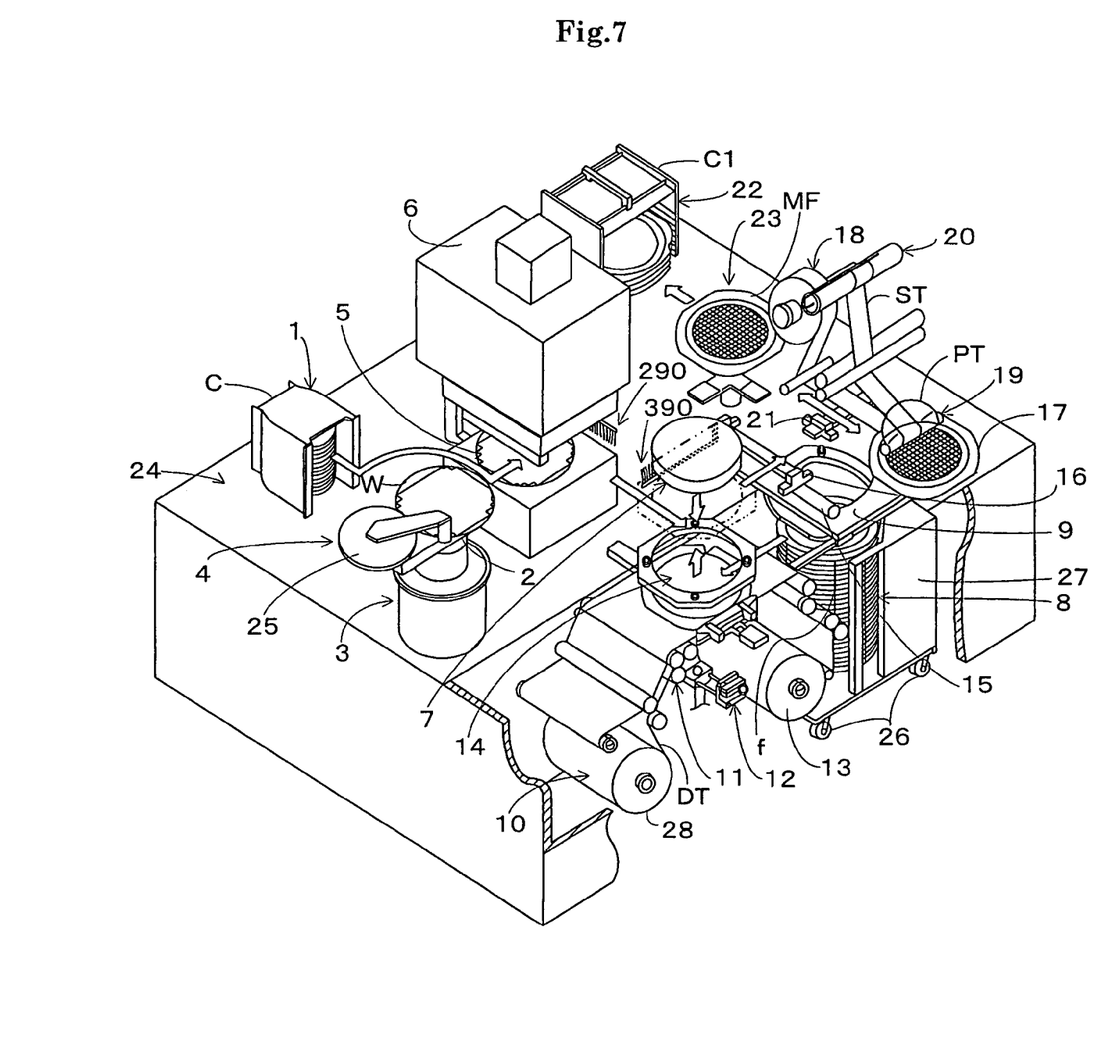
FIG. 7 is a partially cutaway perspective view of an overall construction of a second embodiment of a semiconductor wafer mounting apparatus equipped with a semiconductor wafer transport apparatus related to the present invention.

FIG. 7 is a partially cutaway perspective view of an overall construction of an embodiment of a semiconductor wafer mounting apparatus equipped with a semiconductor wafer transport apparatus related to the present invention.

Figure 8:
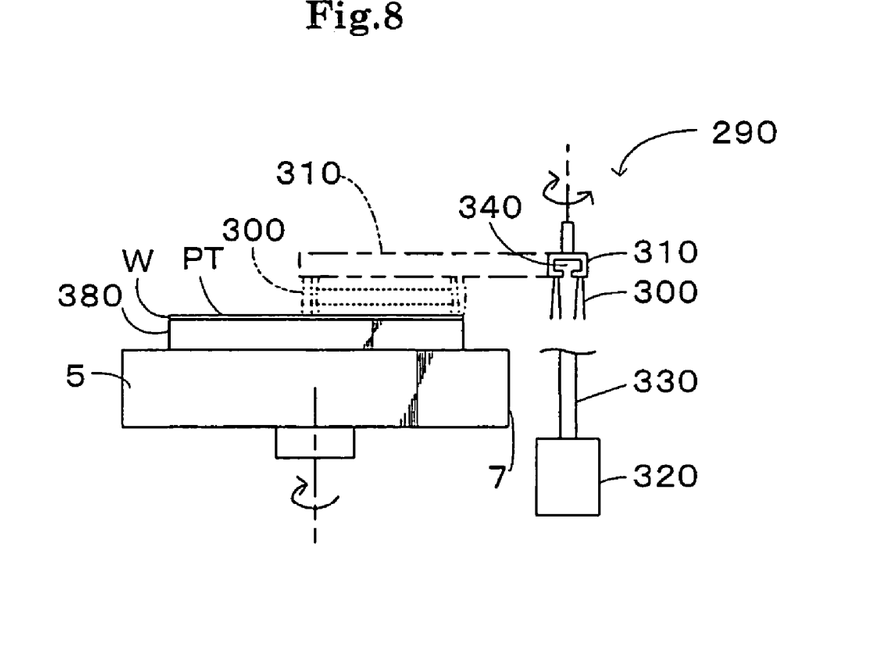
FIG. 8 is a side view of a principal portion showing a first wafer cleaning mechanism.
Figure 9:
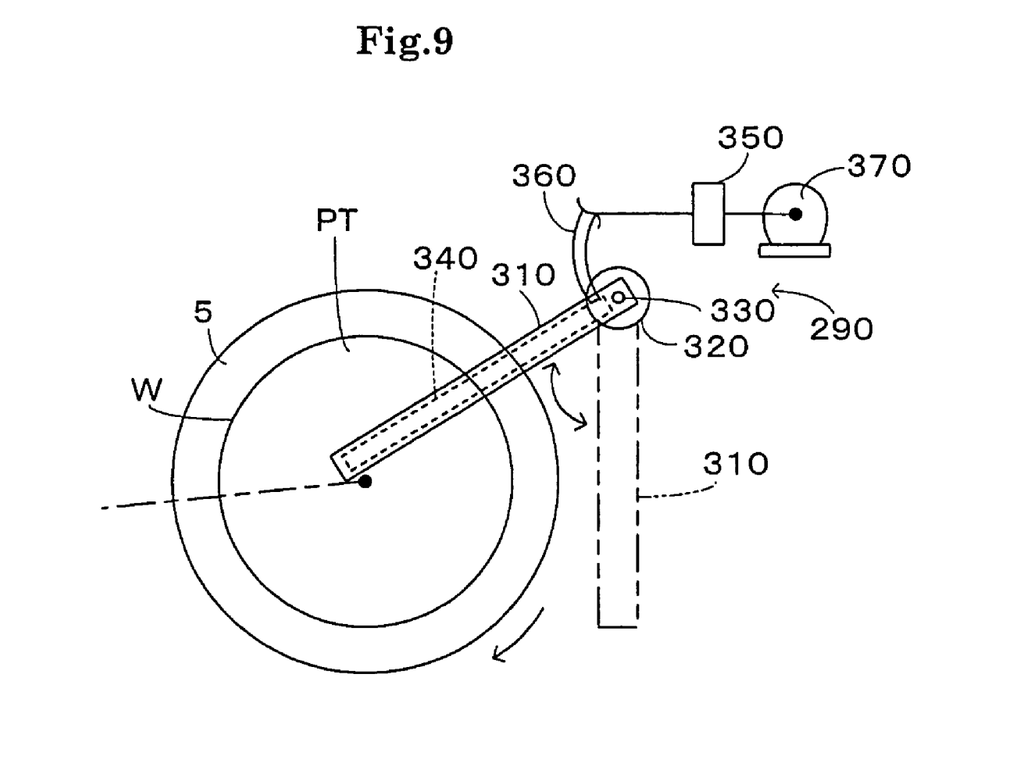
FIG. 9 is a top plan view of the principal portion showing a first wafer cleaning mechanism.

The first wafer cleaning mechanism 290 as a dust removing means is provided in the vicinity of the alignment stage 5 as shown in a side view of a principal portion of the wafer cleaning mechanism 290 (FIG. 8) and in a top plan view thereof (FIG. 9).

The first wafer cleaning mechanism 290 is constructed so that a first brush arm 310 on which first brush bristles 300 are implanted is mounted to a rotary support pole 330 rotatable around the axis thereof extending in a vertical direction with an electric motor 32 rotatable in a normal or reverse direction.

The first brush arm 310 is further constructed so as to move between a working position farther than the center of rotation of the alignment stage 5 and a position where the arm 310 does not overlap the alignment stage 5.

In addition, a first vent path 340 is formed in the first brush arm 310 and, also, the first vent path 340 is open on the lower surface of the first brush arm 310 and a first vacuum pump 370 is connected in communication with the first vent path 340 on the pivotal center side of the first brush arm 310 through a first suction pipe 360 in which a first filter 350 is in series inserted.

With the construction described above, the first brush bristles 300 are shifted to a position where the first brush bristles 300 works on the wafer front surface side of a wafer W that is placed and suction-held on the wafer suction stage 380 as a contact portion on the alignment stage 5, in which state the wafer suction stage 380 is rotated to thereby enable dust attached on the surface protective tape ST applied to the wafer front surface side of the wafer W to be removed and sucked away.

Figure 10:
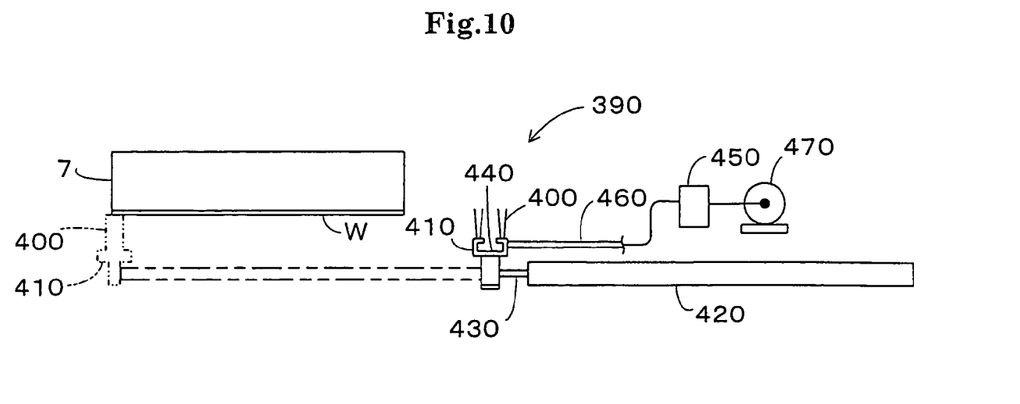
FIG. 10 is a side view of a principal portion showing a second wafer cleaning mechanism.
Figure 11:
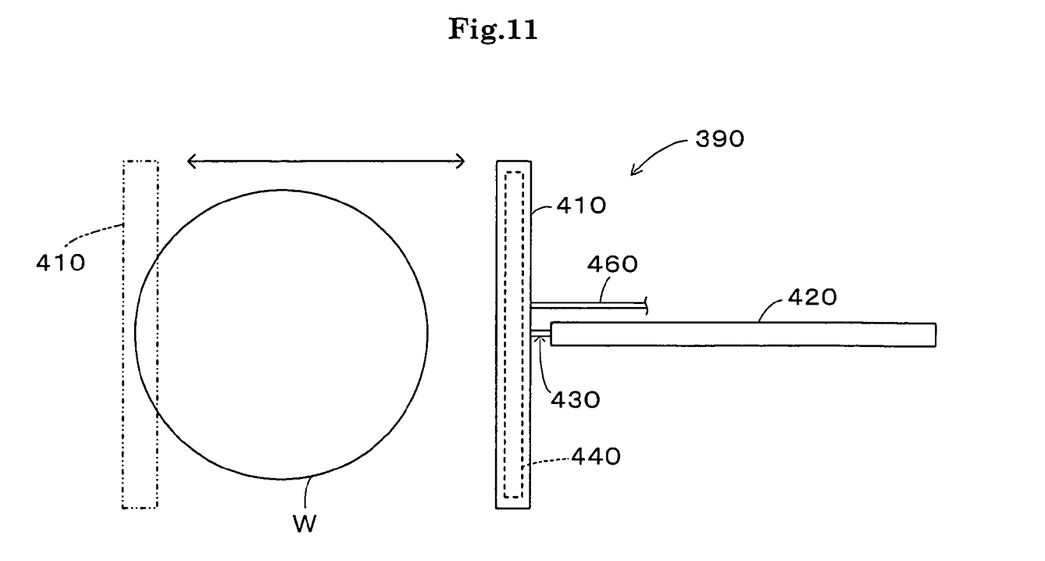
FIG. 11 is a bottom plan view of the principal portion showing a second wafer cleaning mechanism.

A second wafer cleaning mechanism 390 is provided as a dust removing means in the vicinity of the wafer chuck table 7 as shown in the side view of a principal portion of FIG. 10 and in the bottom plan view of a principal portion of FIG. 11.

The second wafer cleaning mechanism 390 is of a construction in which a second brush arm 410 on which second brush bristles 400 are implanted so as to extend upward is attached to a cylinder rod 430 capable of moving forward or backward in a horizontal direction with an air cylinder 420.

The second brush arm 410 is constructed so as to be movable forward or backward to a position farther than the furthest end of the wafer chuck table 7 in a top plan view.

In addition, a second vent path 440 is formed in the second brush arm 410 and, also, the second vent path 440 is open on the upper surface of the second brush arm 410, and a second vacuum pump 470 is connected in communication with the second vent path 440 at the middle of the second brush arm 410 in the length direction through a second suction pipe 460 in which a second filter 450 is in series inserted.

With the construction described above, the second brush bristles 400 are shifted while being caused to work on the back surface of a wafer W that has been transported onto the wafer chuck table 7, in which state dust attached on the back surface of the wafer W can be removed and sucked away.

Then, description will be given of a transport operation by the above-described semiconductor wafer transport apparatus with reference to a flowchart of FIG. 12.

At first, the robot arm 2 is not only pivoted but also stretched or shrunk and moved upward or downward to thereby take out one wafer W while suction-holding from the cassette C of the wafer supplying station 1 (S1). The robot arm 2 is not only pivoted but also stretched or shrunk and moved upward or downward to thereby transport the one wafer W to above the alignment stage 5 and place the wafer W thereon (S2) and the pressing plate 25 is stretched or shrunk and moved upward or downward by the wafer pressing mechanism 4 to press and correct the one wafer W to be planar, in which state the one wafer W is suction-held (S3).

Thereafter, the first brush bristles 300 are pushed on the surface protective tape PT applied on the surface of the wafer W that has been suction-held on the wafer suction stage 380 of the alignment stage 5, in which state the wafer suction stage 380 is rotated while the first vacuum pump 370 is driven to thereby remove dust attached on the surface protective tape PT therefrom (S4).

In the state retained, the wafer suction stage 380 is rotated to thereby align the wafer W based on a detected orientation flat, a notch or the like thereof (S5).

Thereafter, the surface protective tape PT applied to the wafer W, when being of an ultraviolet curable type, is illuminated with ultraviolet on the alignment stage 5 using the ultraviolet illumination unit 6 (S6).

Then, the alignment stage 5 is moved to below the wafer chuck table 7 of the alignment stage 5 and the wafer chuck table 7 is vertically moved while keeping the wafer W in a planar state to transfer the wafer W that has been aligned onto the wafer chuck table 7 (S7). Thereafter, the alignment stage 5 having transferred the wafer W returns to the initial position.

Thereafter, the second brush bristles 400 is moved toward the back surface of the wafer W that is suction-held on the wafer chuck table 7 while the second vacuum pump 470 is driven, so that dust attached to the back surface of the wafer W is removed (S8).

On the other hand, the ring frame transport mechanism 9 sucks by vacuum and takes out an uppermost one and then a next one of the ring frames f stored in the wagon 27, and each ring frame f taken out is aligned on the alignment stage not shown, and then transported to the position, above the dicing tape DT, for applying the dicing tape DT (S9).

Then, the dicing tape DT is applied to the ring frame f with the dicing tape applying unit 11 (S10) and, thereafter, the dicing tape DT is cut on the ring frame f (S11).

The cut, unwanted part of the dicing tape DT is separated from the ring frame f and taken up on the dicing tape collector 13 (S12), and the ring frame f to which the dicing tape DT is applied is prepared and raised with the ring frame lift mechanism 14 and caused to approach the wafer W that is suction-held on the wafer chuck table 7 (S13).

A mount roller (not shown) is moved upward or downward and caused to be migrate starting at a lower end of the ring frame f to thereby apply the dicing tape DT, applied to the ring frame f, to the wafer W and prepare a wafer mount frame MF (S14).

Thereafter, the prepared wafer mount frame MF is transported to above the separator table 17 using the wafer mount frame transport mechanism 16 and is suction-held (S15).

The separator table 17 on which the mount frame MF is placed is moved to below the tape separator unit 19, the separator tape ST supplied from the separator tape server 18 is pressed and applied to the surface protective tape PT on the surface of the wafer W and the applied separator tape ST together with the surface protective tape PT is separated from the surface of the wafer W (S16).

Thereafter, the wafer mount frame MF from which the surface protective tape PT has been separated is discharged from the tape separator unit 19, alignment is conducted based on an orientation flat, a notch or the like with the wafer mount frame accommodating mechanism 21 to thereby adjust a direction of accommodation, the wafer mount frames MF are accommodated into the cassette C1 of the wafer mount frame collector 22 with the wafer mount frame transport mechanism 23 one at a time (S17).

Figure 13:
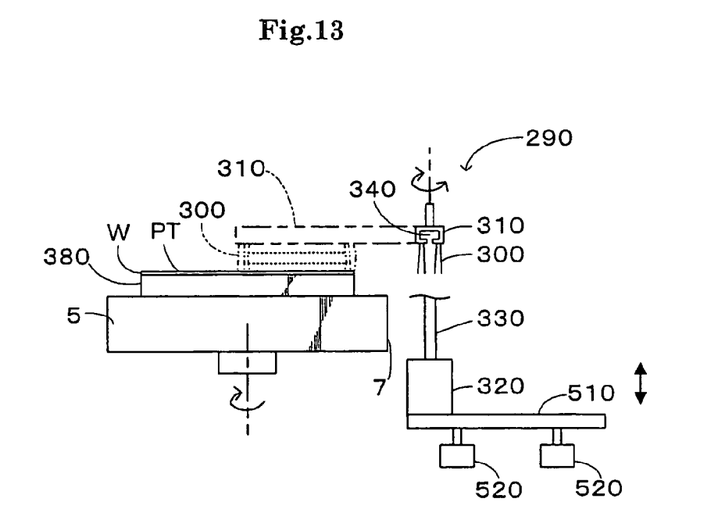
FIG. 13 is a side view of a principal portion showing a modified embodiment of the first wafer cleaning mechanism.

FIG. 13 is a side view showing a modified embodiment of the first wafer cleaning mechanism 290 and a construction which is different from that in the above-described embodiment is as follows.

That is, an electric motor 320 is supported on a vertically moving table 510, the vertically moving table 510 is further supported so as to move vertically by a pair of first vertical movement air cylinder 520. The first vertical movement air cylinders 520 are set such that, the cylinders, when being at the upper stroke ends, brings the first brush bristles 300 to a position (see FIG. 8) where the first brush bristles 300 act on the surface protective tape PT on the wafer W, while on the other hand, when being the lower stroke end, bringing the first brush bristles 300 to a position where the first brush bristles 300 act on the surface of the alignment stage 5. The other constituents of the construction are the same as the above-described embodiment and the same symbols are attached to the same constituents and description thereof will not be given.

Figure 14:
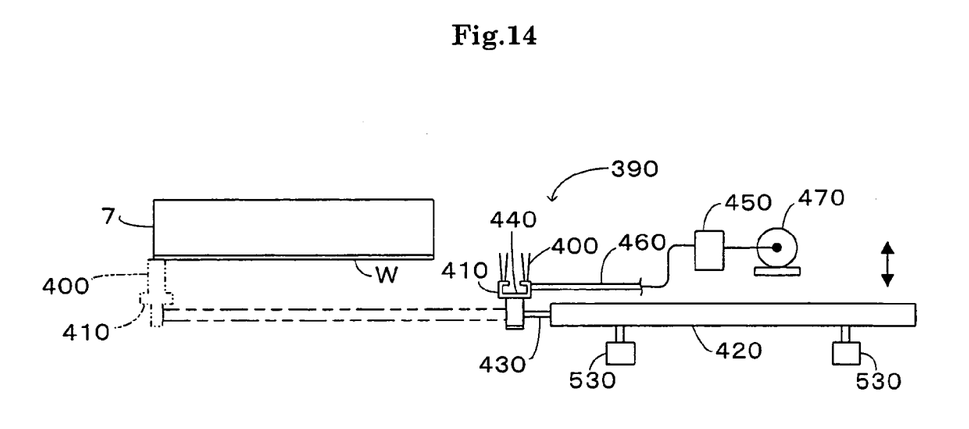
FIG. 14 is a side view of a principal portion showing a modified embodiment of the second wafer cleaning mechanism.

FIG. 14 is a side view showing a modified embodiment of the second wafer cleaning mechanism 390 and a construction which is different from that in the above-described embodiment is as follows.

That is, an air cylinder 420 is supported so as to move vertically by a pair of second vertical movement cylinders 530. The second vertical movement cylinders 530 are set such that the cylinders, when being at the upper stroke ends, brings the second brush bristles 400 to a position where the second brush bristles 400 act on the surface facing downward of the wafer chuck table 7 (see FIG. 10), while on the other hand, when being at the lower stroke ends, bringing the second brush bristles 400 to a position where the second brush bristles 400 act on the back surface of the wafer W. The other constituents of the construction is the same as in the above-described embodiment and the same symbols are attached to the same constituents and description thereof will not be given.

Figure 15:
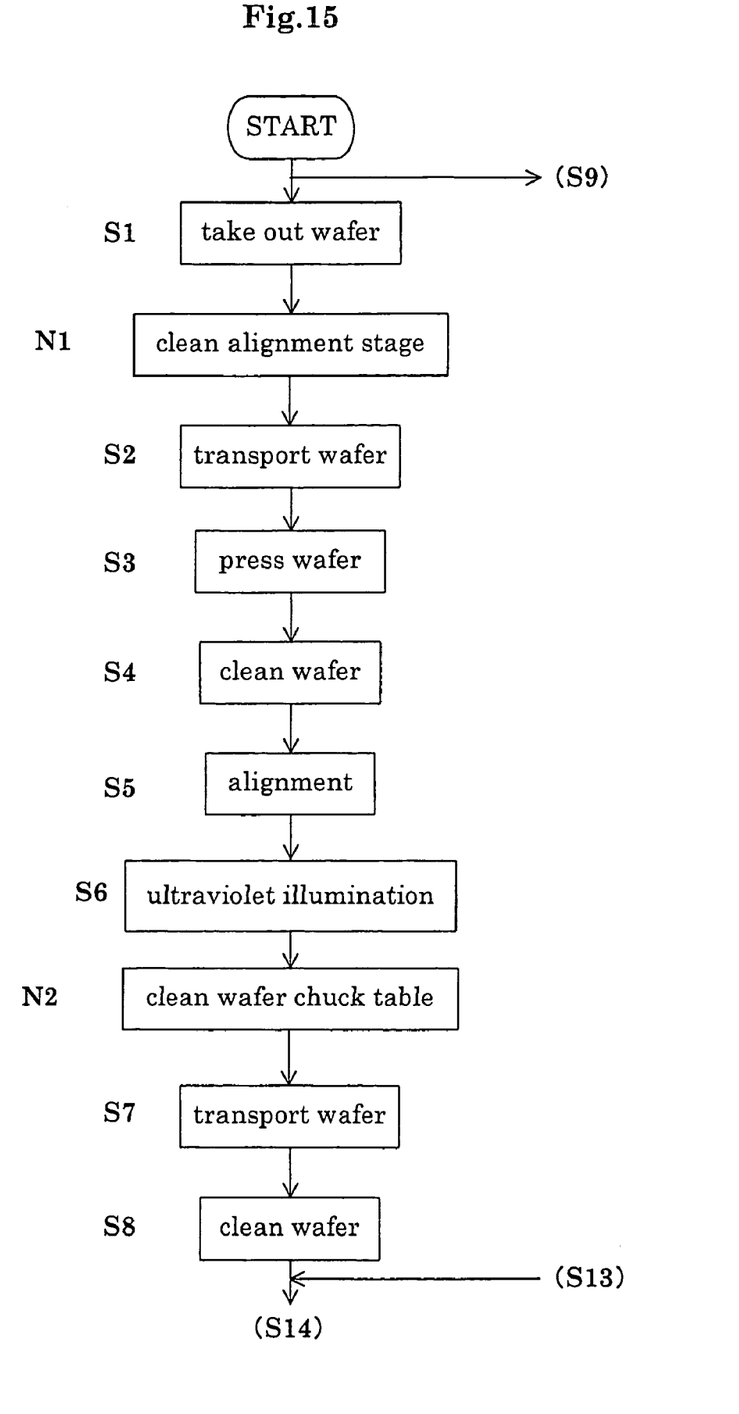
FIG. 15 is a flowchart describing a transport operation with a semiconductor wafer transport apparatus of a modified embodiment.

Then, description will be given of a transport operation of the semiconductor wafer transport apparatuses adopting the both modified embodiments using a flowchart of FIG. 15.

Figure 12:
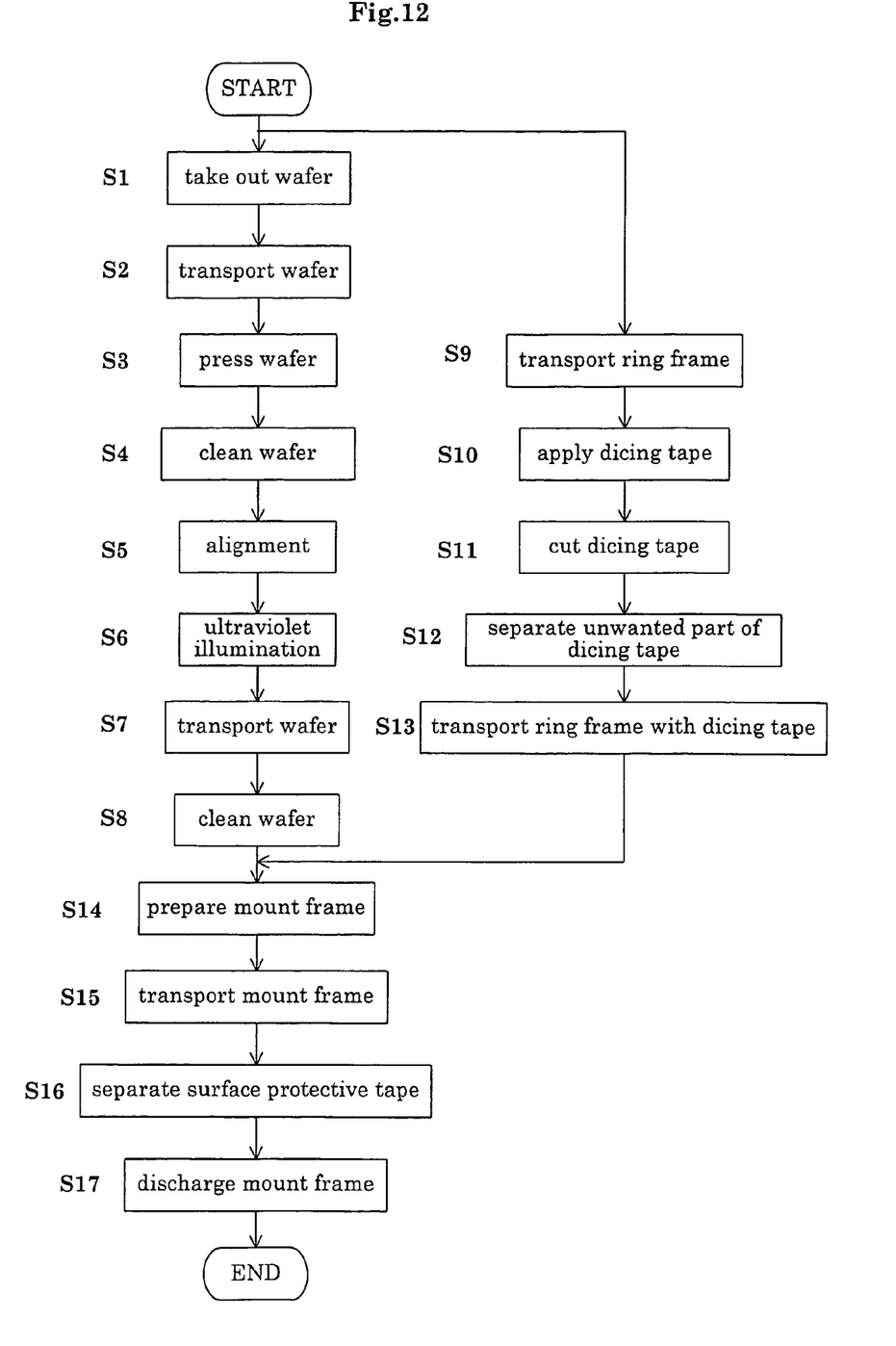
FIG. 12 is a flowchart describing a transport operation with a semiconductor wafer transport apparatus.

After the wafer W is taken out in step S1 in the operation of the above-described embodiment shown in FIG. 12, the first brush bristles 300 are pressed to the wafer suction stage 380 of the alignment stage 5 (see FIG. 13) before the wafer W is transported onto the alignment stage 5, in which state the wafer suction stage 380 is rotated while the first vacuum pump 370 is driven to thereby remove dust attached to the wafer suction stage 380 (N2).

Thereafter, from step S2 to step S3 are operated in a similar way to that of the above-described embodiment and, in step S4, the first vertical movement air cylinders 520 are operated toward the upper stroke ends to press the first brush bristles 300 to the surface protective tape PT on the surface of the wafer W that is placed and suction-held on the wafer suction stage 380 of the alignment stage 5 (see FIG. 8), in which state the wafer suction stage 380 is rotated while the first vacuum pump 370 is driven to thereby remove dust attached to the surface protective tape PT.

Moreover, from step S5 to step S6 are operated in a similar way to that of the above-described embodiment and after ultraviolet illumination in step S6, the second brush bristles 400 is moved on and along the surface facing downward of the wafer chuck table 7 while the second vacuum pump 470 is driven to thereby remove dust attached to the surface facing downward thereof (N2).

Thereafter, after the wafer W is transferred to the wafer chuck table 7 in step S7, the second vertical movement cylinders 530 are operated toward the lower stroke ends to move the second brush bristles 400 on and along the back surface of the wafer W that is suction-held on the wafer chuck table 7 while driving the second vacuum pump 470 to thereby remove dust attached to the back surface of thereof (S8).

Operations from step S9 to step S17 are the same as in the above-described embodiment and description thereof will not be given.

According to a transport operation in the above-described modified embodiments, dust attached to the wafer placement surface of the wafer suction stage 380 of the alignment stage 5 in contact with a wafer W and to the surface facing downward of the wafer chuck table 7 is removed before being brought into contact with the wafer W, leading to an advantageous point that can prevent a production yield from being reduced better due to attachment of dust to the wafer W.

In the above-described modified embodiments, the first brush bristles 520 removing dust attached on a surface of the wafer W are used as the second application for removal of dust attached to the wafer placement surface of the wafer suction stage 380 of the alignment stage 5, while different, specific brush bristles may also be employed as a single application in addition to the first brush bristles 520.

In the above-described modified embodiments, the second brush bristles 530 removing dust attached to the back surface of a wafer W is used as the second application for removal of dust attached to the surface facing downward of the wafer chuck table 7, while different, specific brush bristles may also be employed as a single application in addition to the second brush bristles 530.

In the above-described embodiments, the first wafer cleaning mechanism 290 brings the first brush bristles 300 into contact with a surface of the wafer W that is suction-held on the wafer suction stage 380 and dust is removed by rotating the wafer suction stage 380, while other constructions may be adopted in which the first brush arm 310 is longer than a diameter of the wafer suction stage 380 and the first brush arm 310 is reciprocated with an air cylinder or the like and in which one end of the length direction of the first brush arm 310 is located in the vicinity of the wafer suction stage 380 pivotably around a shaft axis in a vertical direction, by both of which the first brush bristles 300 are caused to act on all the surface of the wafer W that is suction-held on the wafer suction stage 380 and remove away dust.

In the above-described embodiments, the second wafer cleaning mechanism 390 brings the second brush bristles 400 into contact with the back surface of a wafer W that is suction-held on the wafer chuck table 7, and in the state, reciprocates the second brush bristles 400 in a horizontal direction to thereby remove dust, while a construction may also be adopted in which one end of the second brush arm 410 is located in the vicinity of the wafer chuck table 7 pivotably around a shaft axis in a vertical direction to thereby cause the second brush bristles 400 to act on all the back surface of the wafer W that is suction-held on the wafer chuck table 7 and remove away dust.

In the above-described embodiments, removed dust is sucked away with the first and second vacuum pumps 370 and 470, while a construction may also be adopted in which in cleaning, suction mechanisms using vacuum suction or the like are provided at the peripheries of the wafer suction stage 380 of the alignment stage 5 and the wafer chuck table 7, respectively, to thereby suck away dust removed with the first and second brush bristles 300 and 400.

In the above-described embodiments, dust is removed with the first and second brush bristles 300 and 400, while a construction may also be adopted in which as a dust removing means, various kinds of constructions and methods can be applied as far as dust removal and cleaning can be realized, such as dust removal of suction, blowing of a gas, adhesive sheets or a combination thereof, or the like.

In the above-described embodiments, there is shown a case where the wafer mount frame MF is prepared, while the present invention can be applied to all cases where a portion brought in contact with a semiconductor wafer is present, in which state the semiconductor wafer is processed.

The present invention may be embodied in other specific forms without departing from the spirit or essential attributes thereof and, accordingly, reference should be made to the appended claims, rather than to the foregoing specification, as indicating the scope of the invention.

What is claimed is:

1. A semiconductor wafer transport method of transporting a semiconductor wafer to various kinds of processing steps, the method comprising the step of:

suctioning dust attached to a holding surface of an alignment stage while removing the dust using a dust removing means, before placement-holding the semiconductor wafer on the alignment stage;

suctioning dust attached to a first surface acting as a non-holding surface of the semiconductor wafer while removing the dust using the dust removing means, with the semiconductor wafer placement-held at the alignment stage after the dust removing process is completed in the previous process;

suctioning dust attached to a holding surface of a chuck table suction-holding to receive the first surface of the semiconductor wafer held at the alignment stage while removing the dust using the dust removing means; and suctioning dust attached to a second surface of the semiconductor wafer acting as a non-holding surface of the suction-held semiconductor wafer while removing the dust using the dust removing means, the first surface of the semiconductor wafer performed with the dust removing process being suctioned and received at the holding surface of the chuck table performed with the dust removing process.

2. The semiconductor wafer transport method according to claim 1, wherein the dust removing means is an arm having a brush facing each surface to be dust removing processed.

3. A semiconductor wafer transport apparatus comprising:
an alignment stage for receiving, placement-holding, and aligning the semiconductor wafer transported from a pre-step; a first removing dust means for suctioning dust attached to a holding surface of the alignment stage before the semiconductor wafer is placement-held, and a first surface acting as a non-holding surface of the semiconductor wafer when the semiconductor wafer is held at the holding surface while removing the dust;

a chuck table suction-holding to receive the first surface of the semiconductor wafer performed with the alignment stage and the dust removing process, and transporting the semiconductor wafer to a post-process; and a second removing dust means for suctioning dust attached to a holding surface of the chuck table before suction-holding surface of the semiconductor wafer and a second surface acting as a non-holding surface of the semiconductor wafer suction-held by the chuck table while removing the dust.

4. The semiconductor wafer transport apparatus according to claim 3, wherein
the first and second dust removing means are arms having a brush facing the surface to be dust removing processed; and the arm reciprocates on each surface to be dust removing processed.

5. The semiconductor wafer transport apparatus according to claim 3, wherein
the first and second dust removing means are arms having a brush facing the surface to be dust removing processed; the first dust removing means has the arm located in the vicinity of the alignment stage so that one end thereof is pivotable around a shaft axis in the vertical direction; and the second dust removing means has the arm located in the vicinity of the chuck table so that one end thereof is pivotable around a shaft axis in the vertical direction.

6. The semiconductor transport apparatus according to claim 4, wherein
the wafer suction stage of the alignment stage rotates; and the chuck table rotates.

7. The semiconductor transport apparatus according to claim 4, wherein
the semiconductor wafer is attached with an adhesive tape for surface protection on the first surface.

* * * * *